(12) United States Patent
Park

(10) Patent No.: US 7,915,654 B2
(45) Date of Patent: Mar. 29, 2011

(54) IMAGE SENSOR AND A METHOD FOR MANUFACTURING THE SAME

(75) Inventor: Jeong Su Park, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 113 days.

(21) Appl. No.: 12/200,072

(22) Filed: Aug. 28, 2008

(65) Prior Publication Data

US 2009/0057733 A1    Mar. 5, 2009

(30) Foreign Application Priority Data

Aug. 30, 2007 (KR) .................. 10-2007-0087550

(51) Int. Cl.
  *H01L 31/062* (2006.01)
  *H01L 31/113* (2006.01)
(52) U.S. Cl. ............................... 257/292; 438/57
(58) Field of Classification Search .................. 257/292
  See application file for complete search history.

(56) References Cited

U.S. PATENT DOCUMENTS

| 2002/0058353 A1* | 5/2002 | Merrill .......................... 438/57 |
| 2004/0211884 A1* | 10/2004 | Fang et al. ................. 250/214.1 |
| 2006/0197169 A1* | 9/2006 | Cole ............................ 257/431 |

FOREIGN PATENT DOCUMENTS

KR    10-2006-0027662    3/2006

\* cited by examiner

*Primary Examiner* — Thao X Le
*Assistant Examiner* — Geoffrey Ida
(74) *Attorney, Agent, or Firm* — Saliwanchik, Lloyd & Eisenschenk

(57) ABSTRACT

An image sensor and manufacturing method thereof are provided. A semiconductor substrate can include a light blocking region and a light receiving region. A photodiode can be formed in the light blocking region and in the light receiving region. A gate can be disposed at a side of the photodiode in the light receiving region, and a light blocking gate can be disposed on the photodiode in the light blocking region. A salicide layer can be formed on the light blocking gate.

20 Claims, 3 Drawing Sheets

IMAGE SENSOR AND A METHOD FOR MANUFACTURING THE SAME

CROSS-REFERENCE TO RELATED APPLICATION

The present application claims the benefit under 35 U.S.C. §119 of Korean Patent Application No. 10-2007-0087550, filed Aug. 30, 2007, which is hereby incorporated by reference in its entirety.

BACKGROUND

An image sensor is a semiconductor device for converting an optical image into an electrical signal. An image sensor typically includes a light sensing region that senses light and a logic circuit portion which processes the sensed light into the electrical signal to make it data.

In general, a complementary metal oxide semiconductor (CMOS) image sensor includes a photodiode and a MOS transistor in each pixel and makes use of a switching scheme detecting outputs using the photodiode and transistor.

Often, a factor tending to degrade the performance of a CMOS image sensor is a hot pixel. To attempt to solve the problem of a hot pixel, a metal layer is sometimes deposited in a predetermined region of a pixel array to form a light blocking region, and the hot pixel is removed by analyzing the signal of the light blocking region and a light receiving region.

However, the metal layer in the light blocking region is formed on a final metal wiring layer, thereby causing a crack in the device due to stress in a subsequent process. Thus, there exists a need in the art for an improved image sensor and manufacturing method thereof.

BRIEF SUMMARY

Embodiments of the present invention provide an image sensor and manufacturing method thereof capable of forming a light blocking region of a photodiode while forming a gate in a unit pixel.

In an embodiment, an image sensor can include: a semiconductor substrate including a light blocking region and a light receiving region; a light blocking region photodiode formed in the light blocking region; a light receiving region photodiode formed in the light receiving region; a gate disposed on a side of the light receiving region photodiode; a light blocking gate disposed on the light blocking region photodiode; and a salicide layer disposed on the light blocking gate.

In another embodiment, a method for manufacturing an image sensor can include: forming a light blocking region photodiode in a light blocking region on a semiconductor substrate; forming a light receiving region photodiode in a light receiving region on a semiconductor substrate; forming a gate on a side of the light receiving region photodiode; forming a light blocking gate on the light blocking region photodiode; and forming a salicide layer on the light blocking gate.

DETAILED DESCRIPTION

When the terms "on" or "over" or "above" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

An image sensor and a method for manufacturing the same according to embodiments of the present invention will now be described with reference to the accompanying drawings.

Figure 6:
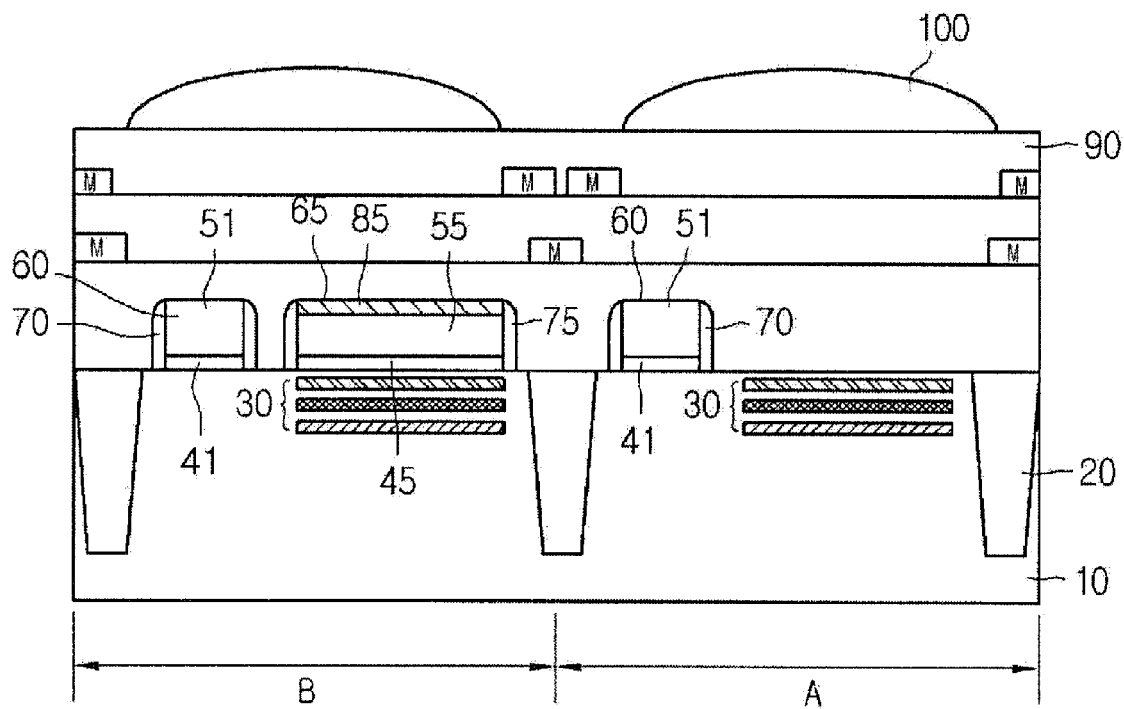

FIG. 6 is a cross-sectional view showing an image sensor according to an embodiment of the present invention.

Referring to FIG. 6, a unit pixel can include a light receiving region A and a light blocking region B on a semiconductor substrate 10.

The light receiving region A can include a photodiode 30 and a gate 60, which is not over the photodiode 30. In an embodiment, the photodiode 30 can include a red photodiode, a green photodiode, and a blue photodiode. Also, the gate 60, which can process photocharges from the photodiode 30, can include a gate insulating layer 41 and a gate electrode 51, and can have a spacer on each side 70. In a specific embodiment, the gate electrode 51 can be formed of polysilicon.

A light blocking gate 65 can be disposed on the photodiode in the light blocking region B. The light blocking gate 65 can have a similar structure as that of the gate 60. The light blocking gate 65 can include a light blocking gate insulating layer 45 and a light blocking gate electrode 55, and can have a spacer 75 on each side. In an embodiment, the width of the light blocking gate 65 can be wider than that of the photodiode 30 in the light blocking region B.

A salicide layer 85 can be disposed on the light blocking gate 65. The salicide layer 85 can be formed of any suitable material known in the art, for example, cobalt, nickel, titanium, or any combination thereof.

A metal wiring layer 90 and a microlens 100 can be disposed on the semiconductor substrate 10 including the light receiving region A and the light blocking region B.

The metal wiring layer 90 can be formed of at least one insulating layer and a plurality of metal wirings M penetrating the insulating layer.

A microlens 100, which can help condense light into the photodiode 30, can be formed for each unit pixel.

The light blocking gate 65 can be disposed on the photodiode 30 in the light blocking region B, making it possible to block light incident on the photodiode 30 in the light blocking region B. Also, the salicide layer 85 can be disposed on the light blocking gate 65 and can provide additional blockage of light incident on the photodiode 30 in the light blocking region B.

The photodiode 30 in the light blocking region B can have light blocked from it by the light blocking gate 65 and the salicide layer 85. When the intensity of light is approximately zero, the difference of a signal generated in the light blocking region B and a signal generated in the light receiving region A at normal temperature and that generated at high temperature can be compared by an image signal processing in a peripheral circuit region. Thus, a hot pixel can be removed from an output image.

FIGS. 1 to 6 are cross-sectional views showing a method for manufacturing an image sensor according to an embodiment of the present invention.

Figure 1:
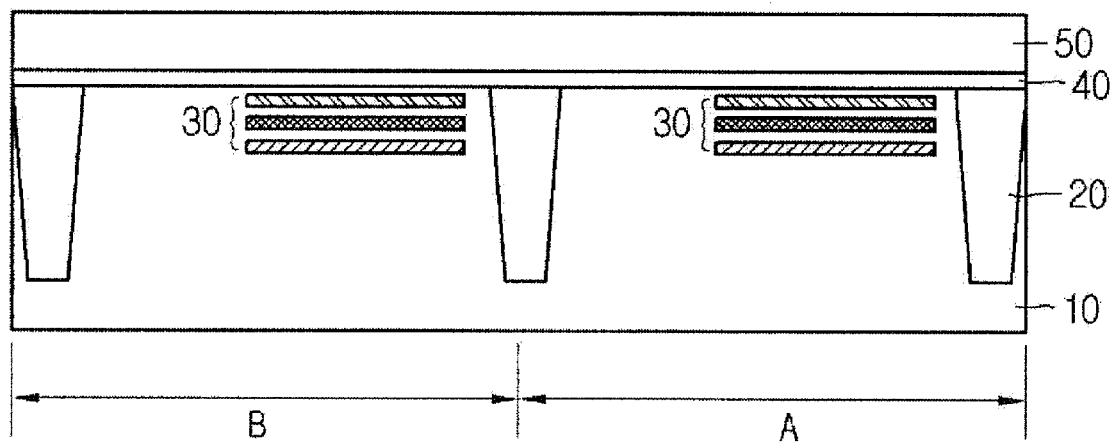
FIGS. 1 to 6 are cross-sectional views showing a process for manufacturing an image sensor according to an embodiment of the present invention.

Referring to FIG. 1, an insulating layer 40 and a conductive layer 50 can be formed on a semiconductor substrate 10 including a photodiode 30.

In an embodiment, the semiconductor substrate 10 can be a high concentration p-type substrate (p++), and an epitaxial process can be performed on the semiconductor substrate 10 to form a low concentration p-type epi layer (p-Epi).

A device isolating layer 20 defining an active region and a field region can be formed on the semiconductor substrate 10.

A plurality of unit pixels can be formed on the semiconductor substrate 10. A region for receiving incident light can be referred to as a light receiving region A, and a region where light is blocked can be referred to as a light blocking region B.

The use of a light receiving region A and a light blocking region B can help to detect and remove a hot pixel which might otherwise degrade the performance of the image sensor. In an embodiment, a signal generated in the light blocking region B and a signal generated in the light receiving region A at predetermined temperature can be compared in the image signal processing in a peripheral circuit region, thereby making it possible to remove the hot pixel from the output image. Therefore, the light blocking region B on the semiconductor substrate 10 can include a portion for blocking light.

The photodiode 30 can be formed in each unit pixel on the light receiving region A and on the light blocking region B. In an embodiment, the photodiode 30 can include a red photodiode, a green photodiode, and a blue photodiode.

The photodiode 30 can implement a high definition image by vertically arranging three colors in one unit pixel. Also, various colors can be represented without a separate color filter process by the photodiode 30.

Figure 2:
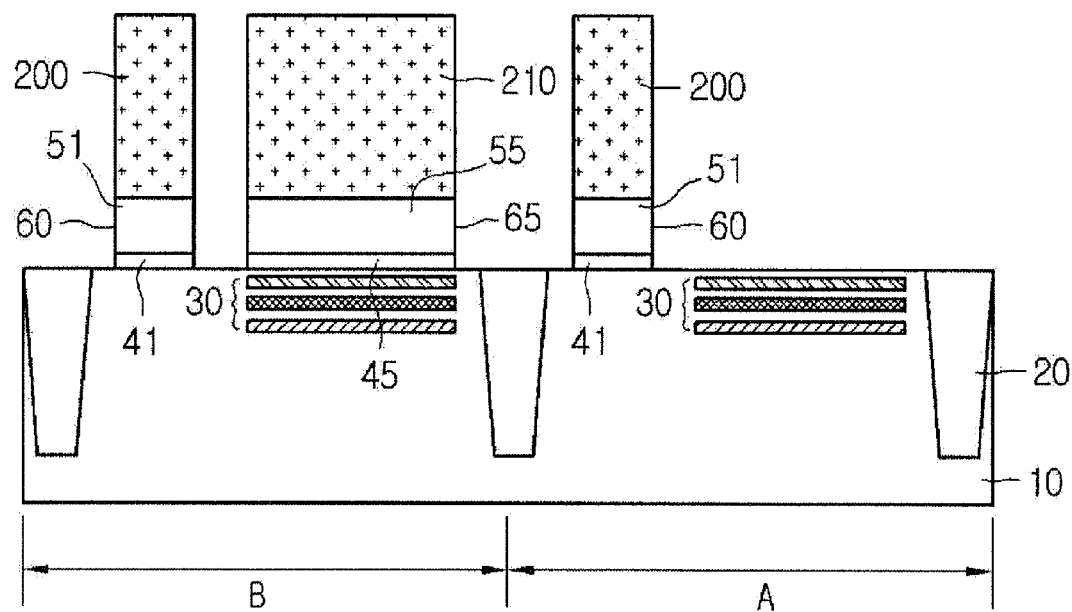

Referring to FIG. 2, a gate 60 can be formed in the light receiving region A and in the light blocking region B, and a light blocking gate 65 can also be formed in the light blocking region B.

In an embodiment, the gate 60 can perform signal processing on photocharges generated in the photodiode 30 in the light receiving region A and the light blocking region B. The light blocking gate 65 can block light incident on the light blocking region B.

Methods for forming the gate 60 and the light blocking gate 65 according to embodiments of the present invention will now be described in detail.

A first photoresist pattern 200 can be formed on a portion the conductive layer 50 that is not over the photodiode 30 in the receiving region A or the light blocking region B. A second photoresist pattern 210 can be formed on the conductive layer 50 over the photodiode 30 in the light blocking region B. In an embodiment, the first photoresist pattern 200 and the second photoresist pattern 210 can be formed simultaneously.

The conductive layer 50 and the insulating layer 40 can be etched using the first photoresist pattern 200 and the second photoresist pattern 210 as an etching mask.

Accordingly, the gate 60 comprising the gate insulating layer 41 and the gate electrode 51 can be formed at a side of the photodiode 30 in the light receiving region A and at a side of the photodiode 30 in the light blocking region B. The light blocking gate 65 comprising the light blocking gate insulating layer 45 and the light blocking gate electrode 55 can be formed over the photodiode in the light blocking region B. In an embodiment, the width of the light blocking gate 65 can be formed to be wider than that of the photodiode 30 to help provide coverage over the entire photodiode 30 in the light blocking region B. Also, in certain embodiments, the light blocking gate 65 can be formed simultaneously with the gate 60.

The light blocking gate 65 can be formed over the photodiode 30 in the light blocking region B so that it can help block light incident on the photodiode 30 in the light blocking region B.

Then, the first photoresist pattern 200 and the second photoresist pattern 210 can be removed. The first photoresist pattern 200 and the second photoresist pattern 210 can be removed by any suitable process known in the art, for example, by an ashing process.

Figure 3:
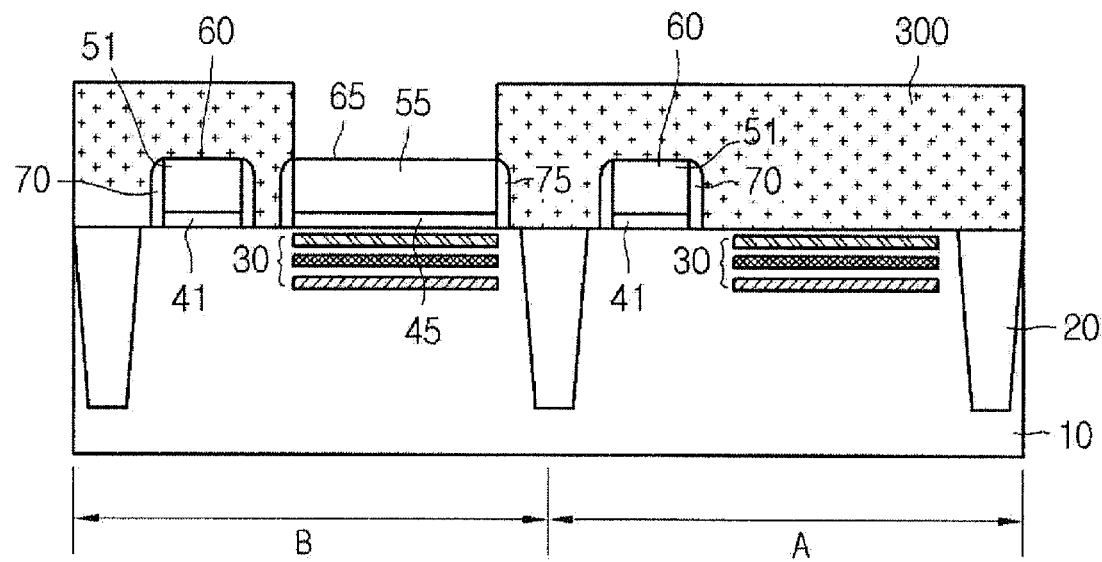

Referring to FIG. 3, spacers 70 can be formed on sides of the gate 60, and spacers 75 can be formed on sides of the light blocking gate 65.

In an embodiment, the spacers 70 and 75 can be formed by depositing an insulating layer on the semiconductor substrate 10 including the gate 60 and the light blocking gate 65 and then performing an etching process to form the spacers 70 and 75.

A third photoresist pattern 300 can be formed on the semiconductor substrate 10, the gate 60, and the spacers 70 and 75, such that the light blocking gate 65 in the light blocking region B is exposed.

Figure 4:
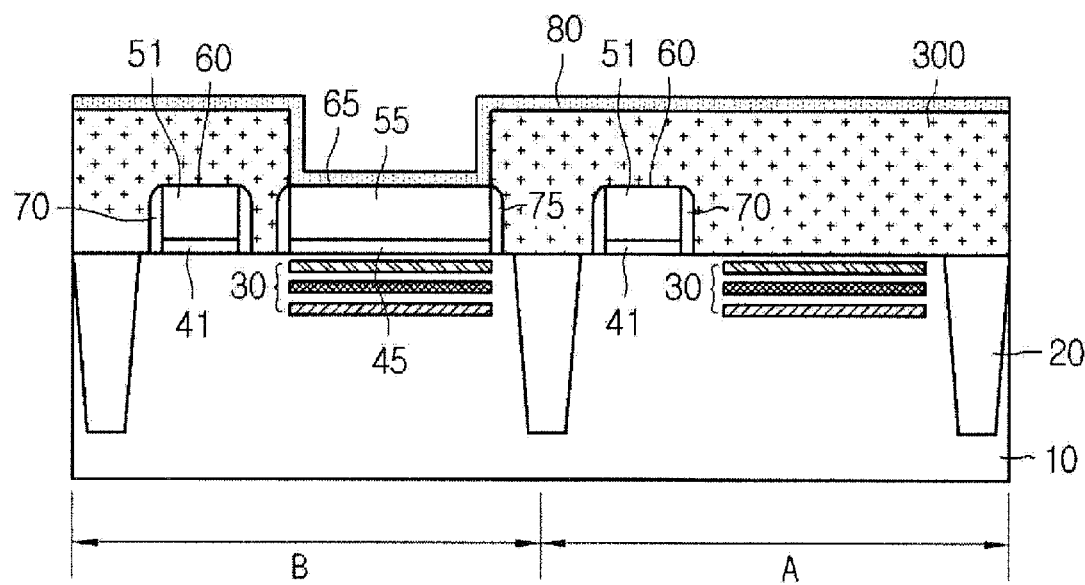

Referring to FIG. 4, a metal layer 80 can be formed on the light blocking gate 65 and the third photoresist pattern 300.

The metal layer 80 can be formed of any suitable material known in the art, for example, cobalt, nickel, titanium, or any combination thereof.

Figure 5:
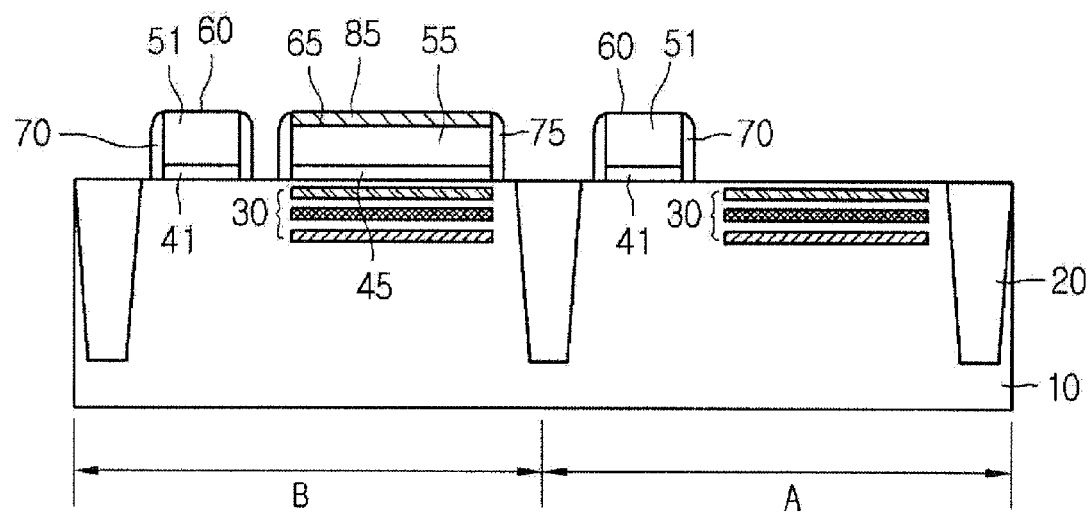

Referring to FIG. 5, a salicide layer 85 can be formed on the light blocking gate 65.

In an embodiment, the salicide layer 85 can be formed by performing a heat treatment process on the metal layer 80. That is, the heat treatment process can be performed on the metal layer 80 to salicide the metal layer 80 by reacting it with polysilicon from the light blocking gate 65 below the metal layer 80. Then, the third photoresist pattern 300 and a portion of the metal layer 80 not on the light blocking gate 65 can be removed, leaving the salicide layer 85, which can be a compound of metal and polysilicon, on the light blocking gate 65.

The salicide layer 85 can be formed on the light blocking gate 65 to help block light from the photodiode 30 in the light blocking region B.

Referring to FIG. 6, a metal wiring layer 90 and a microlens 100 can be formed on the light receiving region A and the light blocking region B.

The metal wiring layer 90 can include an insulating layer and at least one metal wiring M penetrating the insulating layer. In an embodiment, the metal wiring layer 90 can be formed of a plurality of insulating layers and metal wirings M. Each metal wiring M can be disposed such that it is not over the photodiode 30.

The microlens 100 can be formed on the metal wiring layer 90. In an embodiment, microlens material can be applied and then patterned according to unit pixel and subjected to a reflow process to form the microlens 100 in a dome shape. A microlens 100 can be formed for each unit pixel, making it possible to condense light into the photodiode 30 in the lower portion thereof.

In an image sensor according to embodiments of the present invention, the problem of a hot pixel occurring can be controlled. If present, a hot pixel can be processed by an image signal processor in a peripheral circuit unit. In the present invention, the light receiving region A and the light blocking region B can be formed within a pixel array to compare a signal difference between each region, thereby making it possible to remove the hot pixel. For example, when the intensity of light is approximately zero, the signal difference in the light receiving region A and the light blocking region B at normal temperature can be calculated. Then, the signal difference in the light receiving region A and the light blocking region B at high temperature can be compared. If a hot pixel occurs due to the influence of temperature in the light receiving region A, since the signal difference in the light receiving region A and the light blocking region B can be large, the hot pixel can be removed from the output image by the image signal processor.

According to embodiments of the present invention, the light blocking gate 65 can block light incident on the photodiode 30 in the light blocking region B. In certain embodiments, the light blocking gate 65 can be simultaneously formed when forming the gate 60 on the light receiving region A and the gate 60 on the light blocking region B. The light blocking gate 65 can be formed of polysilicon at a thickness to block light incident on the photodiode 30 in the light blocking region B.

Also, by forming the light blocking gate 65 simultaneously when forming the gate 60, a process step can be reduced, thereby enhancing productivity.

Additionally, the salicide layer 85 can be formed on the light blocking gate 65 to provide additional blockage of light incident on the photodiode 30 in the light blocking region B.

Moreover, the salicide layer 85 can block light incident on the photodiode 30 in the light blocking region B so that neither a process for manufacturing a separate mask nor a subsequent process for blocking light incident on the light blocking region B is needed. Thus, the manufacturing process can be simplified, costs can be reduced, and performance of the image sensor can be improved.

According to certain embodiments, the light blocking gate can be formed over the photodiode simultaneously as the gate is formed, making it possible to simplify the manufacturing process and increase productivity.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
    a semiconductor substrate including a light blocking region and a light receiving region;
    a light blocking region photodiode formed in the light blocking region, wherein the light blocking region photodiode comprises a red photodiode, a green photodiode, and a blue photodiode vertically arranged;
    a light receiving region photodiode formed in the light receiving region;
    a gate disposed at a side of the light receiving region photodiode;
    a light blocking gate disposed on the light blocking region photodiode, wherein a width of the light blocking gate is wider than that of the light blocking region photodiode; and
    a silicide layer disposed on the light blocking gate.

2. The image sensor according to claim 1, wherein the light receiving region photodiode comprises a red photodiode, a green photodiode, and a blue photodiode vertically arranged.

3. The image sensor according to claim 1, wherein the gate comprises a gate insulating layer and a gate electrode, and wherein the gate electrode comprises polysilicon.

4. The image sensor according to claim 1, wherein the light blocking gate comprises a light blocking gate insulating layer and a light blocking gate electrode, and wherein the light blocking gate electrode comprises polysilicon.

5. The image sensor according to claim 1, wherein the silicide layer comprises cobalt, nickel, titanium, or any combination thereof.

6. The image sensor according to claim 1, further comprising:
    a metal wiring layer disposed on the light receiving region and the light blocking region; and
    a microlens disposed on the metal wiring layer.

7. The image sensor according to claim 1, further comprising a second gate at a side of the light blocking region photodiode in the light blocking region.

8. A method for manufacturing an image sensor, comprising:
    forming a light blocking region photodiode in a light blocking region of a semiconductor substrate and a light receiving region photodiode in a light receiving region of the semiconductor substrate wherein the light blocking region photodiode comprises a red photodiode, a green photodiode, and a blue photodiode vertically arranged;
    forming a gate at a side of the light receiving region photodiode;
    forming a light blocking gate on the light blocking region photodiode, wherein a width of the light blocking gate is wider than that of light blocking region photodiode; and
    forming a silicide layer on the light blocking gate.

9. The method according to claim 8, wherein the light receiving region photodiode comprises a red photodiode, a green photodiode, and a blue photodiode vertically arranged.

10. The method according to claim 8, wherein the gate and the light blocking gate are formed simultaneously through a process comprising:
    forming an insulating layer on the light receiving region including the light receiving region photodiode and on the light blocking region including the light blocking region photodiode;
    forming a conductive layer on the insulating layer; and
    patterning the insulating layer and the conductive layer to form the gate and the light blocking gate.

11. The method according to claim 10, wherein patterning the insulating layer and the conductive layer comprises:
    forming a first photoresist pattern on the conductive layer at a side of the light receiving region photodiode;
    forming a second photoresist pattern on the conductive layer over the light blocking region photodiode;
    etching the insulating layer and the conductive layer using the first photoresist pattern and the second photoresist pattern as an etching mask; and
    removing the first photoresist pattern and the second photoresist pattern.

12. The method according to claim 11, wherein the first photoresist pattern and the second photoresist pattern are formed simultaneously.

13. The method according to claim 10, wherein the conductive layer comprises polysilicon.

14. The method according to claim 8, wherein forming the salicide layer comprises:
   forming a third photoresist pattern on the semiconductor substrate and the gate, the third photoresist pattern exposing the light blocking gate;
   depositing a metal layer on the third photoresist pattern and the light blocking gate;
   performing a heat treatment process on the metal layer, reacting the metal layer with the exposed light blocking gate; and
   removing the third photoresist pattern and an unreacted portion of the metal layer.

15. The method according to claim 8, wherein the silicide layer comprises cobalt, nickel, titanium, or any combination thereof.

16. The method according to claim 8, further comprising forming a second gate at a side of the light blocking region photodiode in the light blocking region.

17. The method according to claim 16, wherein the gate, the light blocking gate, and the second gate are formed simultaneously through a process comprising:
   forming an insulating layer on the light receiving region including the light receiving region photodiode and on the light blocking region including the light blocking region photodiode;
   forming a conductive layer on the insulating layer; and
   patterning the insulating layer and the conductive layer to form the gate, the light blocking gate, and the second gate.

18. The method according to claim 17, wherein patterning the insulating layer and the conductive layer comprises:
   forming a first photoresist pattern on the conductive layer at a side of the light receiving region photodiode and at a side of the light blocking region photodiode;
   forming a second photoresist pattern on the conductive layer over the light blocking region photodiode;
   etching the insulating layer and the conductive layer using the first photoresist pattern and the second photoresist pattern as an etching mask; and
   removing the first photoresist pattern and the second photoresist pattern.

19. The method according to claim 18, wherein the first photoresist pattern and the second photoresist pattern are formed simultaneously.

20. The method according to claim 8, further comprising:
   forming a metal wiring layer on the semiconductor substrate including the gate and the light blocking gate; and
   forming a microlens on the metal wiring layer.

* * * * *